United States Patent [19]
Oketani et al.

[11] Patent Number: 6,039,680
[45] Date of Patent: Mar. 21, 2000

[54] TOOL CHANGING MECHANISM

[75] Inventors: Tetsuya Oketani, Gifu; Tadashi Uemura, Anjo, both of Japan

[73] Assignee: Howa Machinery, Ltd., Aichi-ken, Japan

[21] Appl. No.: 09/118,344

[22] Filed: Jul. 17, 1998

[30] Foreign Application Priority Data

Jul. 23, 1997 [JP] Japan .................................. 9-214024

[51] Int. Cl.⁷ .............................................. B23Q 3/157
[52] U.S. Cl. ................... 483/57; 483/47; 483/56
[58] Field of Search ................ 483/47, 54, 55, 483/56, 57

[56] References Cited

U.S. PATENT DOCUMENTS

| | | | |
|---|---|---|---|
| 4,596,067 | 6/1986 | Raiteri | 483/57 X |
| 5,111,573 | 5/1992 | Ito | 483/56 X |
| 5,462,512 | 10/1995 | Hiroshima et al. | 483/57 |

FOREIGN PATENT DOCUMENTS

| | | | |
|---|---|---|---|
| 44547 | 3/1986 | Japan | 483/55 |
| 166936 | 7/1987 | Japan | 483/57 |
| 161233 | 7/1991 | Japan | 485/57 |
| 4-2437A | 1/1992 | Japan . | |
| 4-122537A | 4/1992 | Japan . | |

*Primary Examiner*—William Briggs
*Attorney, Agent, or Firm*—Ladas & Parry

[57] ABSTRACT

A spindle head having a spindle is moved along a Y-axis relative to the fixed bed of a printed-circuit board drilling machine, a work table is moved along an X-axis perpendicular to the Y-axis, and a tool magazine is moved along a β-axis parallel to the Y-axis relative to the work table to bring the respective axes of the spindle and desired one of a plurality of tool posts arranged in rows and columns in the tool magazine into alignment with the axis of a pressing member included in a tool pressing mechanism fixedly held on the fixed bed under a tool changing position. The tool pressing mechanism is actuated to transfer a tool from the tool post to a chuck attached to the spindle or from the chuck to the tool post. The work table is lightweight and hence can be rapidly moved. The tool changing mechanism needs only simple control for a tool changing operation.

19 Claims, 4 Drawing Sheets

TOOL CHANGING MECHANISM

BACKGROUND OF THE INVENTION

1. Field of the Invention

The present invention relates to a tool changing mechanism to be incorporated into, for example, a printed-circuit board drilling machine, and a tool pressing mechanism included in the tool changing mechanism.

2. Description of the Related Art

A known tool changing mechanism disclosed in JP No. 4-2437A and employed in a printed-circuit board drilling machine has a tool magazine comprising a plurality of tool posts arranged in rows, and a plurality of pressing cylinder actuators arranged so as to correspond to the tool posts, respectively. The tool magazine including the pressing cylinder actuators is fixedly held on a movable work table. The pressing cylinder actuators are controlled individually by a controller. The position of the movable work table with respect to a cross feed direction and the position of the spindle of the printed-circuit board drilling machine with respect to a longitudinal feed direction are adjusted to locate a desired one of the tool posts held in the tool magazine in alignment with the spindle. Then, the controller controls the pressing cylinder actuator corresponding to the desired tool post to transfer a tool from the tool post to the spindle or to transfer a tool from the spindle to the tool post.

Another known tool changing mechanism disclosed in JP 4-122537A and employed in a printed-circuit board drilling machine has a tool magazine comprising a plurality of tool posts, and a plurality of pressing cylinder actuators arranged so as to correspond to the tool posts, respectively. All the pressing cylinder actuators are controlled for simultaneous operation by a controller. The pressure to be exerted on the tool by each pressing cylinder actuator is adjusted so that the pressing rod of the cylinder actuator is moved back when the spindle of the printed-circuit board drilling machine exerts a pressure on the shank of a tool held on the tool post corresponding to the pressing cylinder actuator.

Each of those known tool changing mechanisms is provided with a plurality of pressing cylinder actuators respectively corresponding to a plurality of tool posts held in the tool magazine. Therefore, those known tool changing mechanisms need a large number of parts including O-rings, pistons and sealing members, need much time for the assembling work and are costly. The pitches of the tool posts are dependent on the diameter of the cylinders of the pressing cylinder actuators. Since each pressing cylinder actuator exerts a pressure directly on the spindle when transferring the tool between the tool post and the spindle, a large axial load is exerted on bearings, such as pneumatic bearings employed in the printed-circuit board drilling machine, supporting the spindle for rotation, which is possible to reduce the accuracy of rotation of the spindle. Accordingly, a special cylinder actuator having a cylinder of a small diameter and a small pressing capacity has been used as the pressing cylinder actuator to avoid exerting an excessive axial load on the bearings supporting the spindle. Such a special cylinder actuator, however, is expensive and increases the cost of the tool changing mechanism. Since the movable work table holding the tool magazine including the plurality of pressing cylinder actuators is heavy and hence the same cannot be rapidly moved.

The controller of the former known tool changing mechanism needs to control the pressing cylinder actuators individually. Therefore, the controller has a complicated configuration and needs complicated piping. The controller of the latter known tool changing machine does not control the pressing cylinder actuators individually, which is the advantage of the latter known tool changing machine over the former tool changing machine. However, since the all the pressing cylinder actuators are actuated simultaneously in the latter known tool changing machine, the latter known tool changing machine consumes more compressed air than the former known tool changing machine, which is economically disadvantageous.

Accordingly, it is an object of the present invention to provide a tool changing mechanism provided with tool pressing mechanisms not subject to many dimensional restrictions, not fixedly held on a movable work table to enable the movable work table to be moved rapidly, and capable of being easily controlled for tool changing operations and of being manufactured at a low manufacturing cost.

SUMMARY OF THE INVENTION

With the foregoing object in view, the present invention provides a tool changing mechanism to be incorporated into a plate drilling machine having a spindle, comprising: a tool magazine including a plurality of tool posts, capable of being moved to bring one of the tool posts into alignment with the spindle; a locating mechanism for locating the tool magazine so that one of the tool posts is brought into alignment with the spindle; and a tool pressing mechanism fixedly disposed opposite to the spindle with respect to the tool magazine at a tool changing position provided in a range in which the spindle is movable, the tool pressing mechanism being operable to press one of the tool posts aligned with the spindle toward the spindle for a tool changing operation.

Since only the single tool pressing mechanism is fixedly disposed opposite to the spindle, the number of the component parts of the tool changing mechanism is far less than that of the component parts of the known tool changing mechanism, and the tool changing mechanism needs a controller of a simple configuration. If pneumatic cylinder actuators are employed as the tool pressing mechanism, the number of the pneumatic cylinder actuators is equal to that of the spindles and the tool pressing mechanism consumes only a small amount of compressed air.

Since the tool pressing mechanism is not held on a movable work table, the movable work table can be moved at increased speed. Since the tool pressing mechanism is fixedly held in place and is separate from the tool magazine, the dimensions of the tool pressing mechanism are not dependent on the size of the tool posts, and the tool pressing mechanism may be an inexpensive general-purpose cylinder actuator.

The above and other objects, features and advantages of the present invention will become more apparent from the following description taken in connection with the accompanying drawings.

DESCRIPTION OF THE PREFERRED EMBODIMENTS

Figure 1:
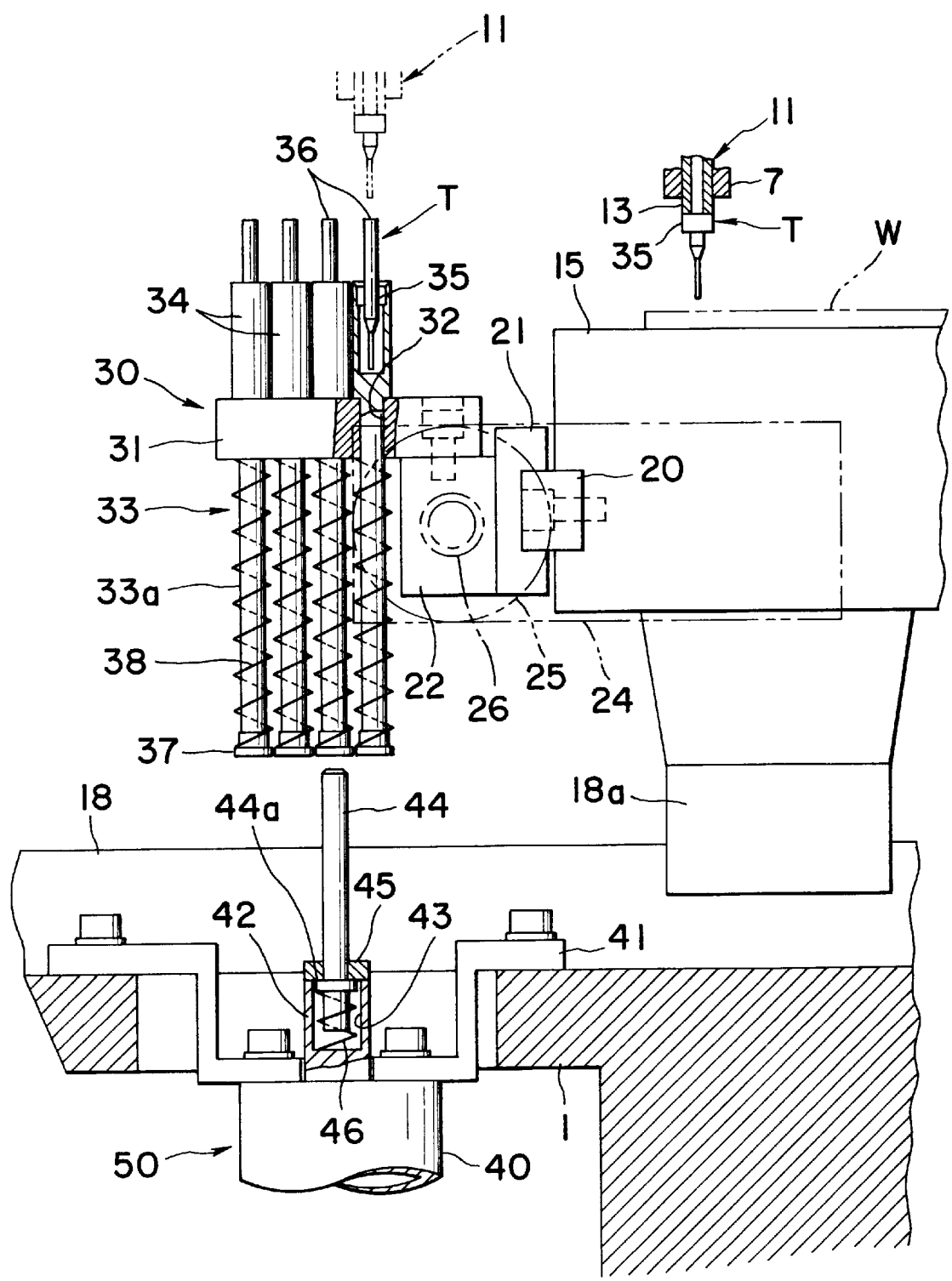
FIG. 1 is a partly sectional front view of a tool changing mechanism in a preferred embodiment according to the present invention.
Figure 2:
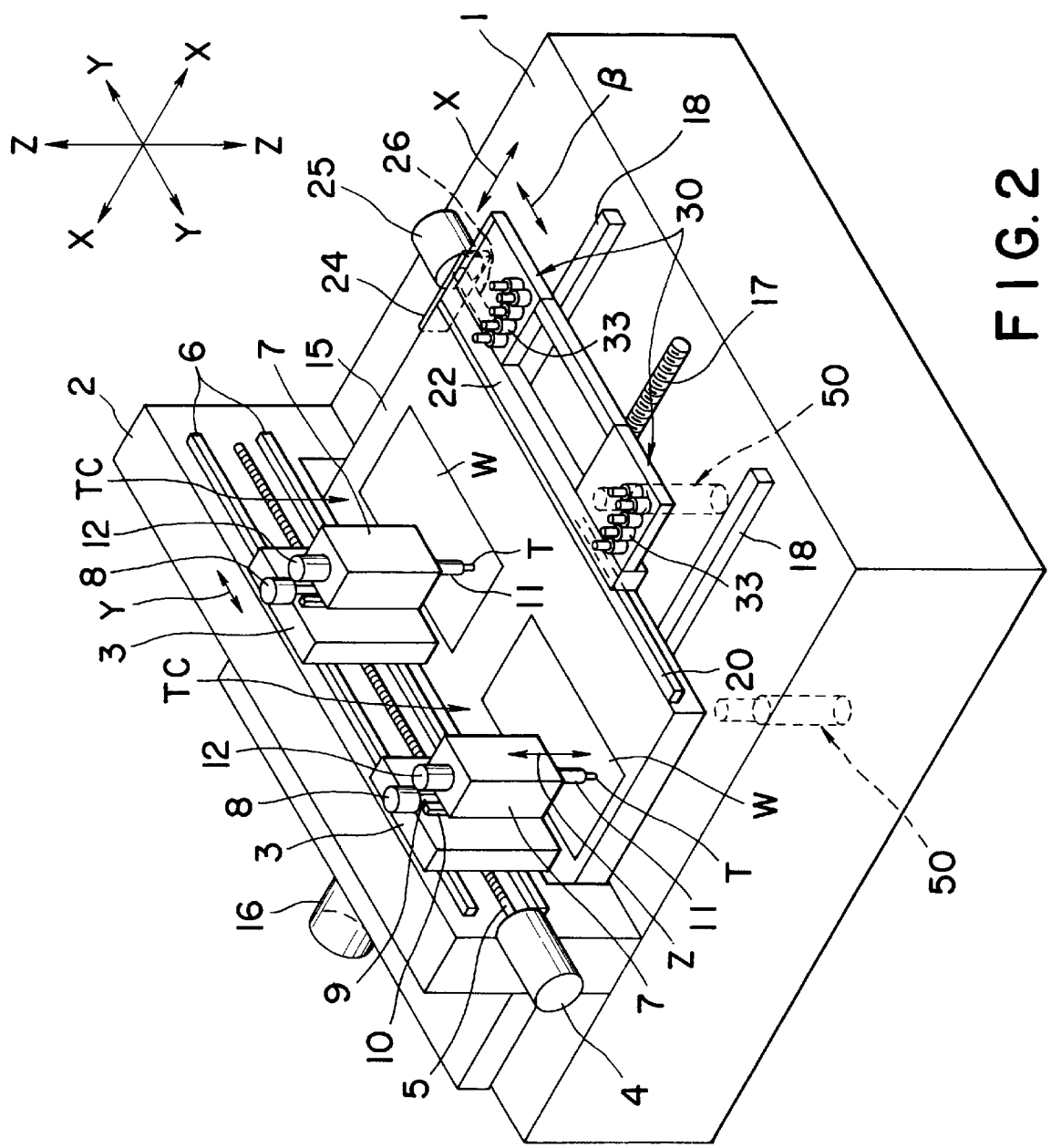
FIG. 2 is a perspective view of a printed-circuit board drilling machine.

A printed-circuit board drilling machine will be described prior to the description of the preferred embodiment of the present invention. Referring to FIG. 2, a double-housing type column 2 is fixedly mounted on a fixed bed 1. Two machining head 3 are supported on the column 2 and are moved synchronously in horizontal directions, i.e., directions parallel to a Y-axis, along guide rails 6 by a feed screw mechanism 5 driven by a Y-axis motor 4. A spindle head 7 included in each machining head 3 can be moved in vertical directions, i.e., directions parallel to a Z-axis, along a guide rails 10 by feed screw mechanism 9 driven by a Z-axis motor 8. A spindle 11 supported for rotation on the spindle head 7 is driven for rotation by a spindle motor 12. As shown in FIG. 1, a chuck 13 capable of chucking and releasing a tool T is held on the lower end part of the spindle 11.

A work table 15 disposed under the column 2 is moved in cross-feed directions, i.e., directions parallel to an X-axis, along guide rails 18 by a feed screw mechanism 17 driven by an X-axis motor 16. A guide rail 20 is fixed to the front end of the work table 15 so as to extend in parallel to the Y-axis. As shown in FIG. 1, a slide block 21 is put on the guide rail 20 for sliding movement along the guide rail 20. A magazine frame 22 is fixedly joined to the slide block 21. Two tool magazines 30 respectively corresponding to the two spindles 11 are held on the magazine frame 22. As shown in FIG. 2, a motor support bracket 24 is fixed to one side end of the work table 15, and a $\beta$-axis motor 25 is supported on the motor support bracket 24. A feed screw 26 is engaged with a threaded hole formed in a block, not shown, attached to the end of the magazine frame 22. The feed screw 26 is driven for rotation by the $\beta$-axis motor 25 to move the magazine frame 22 in horizontal directions, i.e., directions parallel to a $\beta$-axis, along the guide rail 20. The distance along the Y-axis between two tool changing positions TC, which will be explained later, is equal to the center distance along the Y-axis between the two tool magazines 30. Two tool posts 33 held respectively at corresponding positions on the two tool magazines 30 among a plurality of tool posts 33 can be simultaneously located so as to be aligned with the respective axes of the two spindles 11 located respectively at the two tool changing positions TC by the combined effect of the movement of the work table 15 along the X-axis and the movement of the magazine frame 22 along the Y-axis.

The two tool magazines 30 are identical with each other. As shown in FIG. 1, each tool magazine 30 has a tool post support member 31 fixedly joined to the magazine frame 22. The tool post support member 31 is provided with a plurality of guide holes 32 in rows parallel to the $\beta$-axis and columns parallel to the X-axis. The plurality of tool posts 33 are inserted in the guide holes 32, respectively, so as to be vertically movable. Each tool post 33 has a stem 33a of a smaller diameter inserted in the guide hole 32 and provided with a flange 37 at its lower end, and a tool holding head 34 of a larger diameter extending upward from the upper end of the stem 33a. A tool T is supported by its collar 35 in the tool holding head 34 of the tool post 33 in a vertical position with its cutting section directed downward and with a part of its shank 36 projecting upward from the upper end of the tool holding head 34 by a predetermined length. A compression spring 38 is wound around the stem 33a of the tool post 33 and is strained between the flange 37 and the lower surface of the tool post support member 31 to bias the tool post 33 downward so that the lower end of the tool holding head 34 rests on the upper surface of the tool post support member 31.

A tool changing position TC is set for each spindle 11 in the moving range along the Y-axis of the same spindle 11. Pressing mechanisms 50 are disposed so that the axes of the spindles 11 located at the tool changing positions TC above the pressing mechanisms 50 are aligned with the axes of the corresponding pressing mechanisms 50, respectively. Each pressing mechanism 50 has a pressing cylinder actuator 40 held on a bracket 41 fixed to the fixed bed 1 and provided with a piston rod 42 which is moved axially in vertical directions. A lower part of a lifting rod 44 to be brought into contact with the lower end of the tool post 33 is inserted in a bore 43 formed in the upper end part of the piston rod 42 so that the lifting rod 44 is able to move axially relative to the piston rod 42. A flange 44a is formed in the lower part of the lifting rod 44 inserted in the bore 43 of the piston rod 42. A compression spring 46 is strained between the bottom of the bore 43 and the flange 44a to bias the lifting rod 44 upward.

Figures 4A, 4B, 4C:
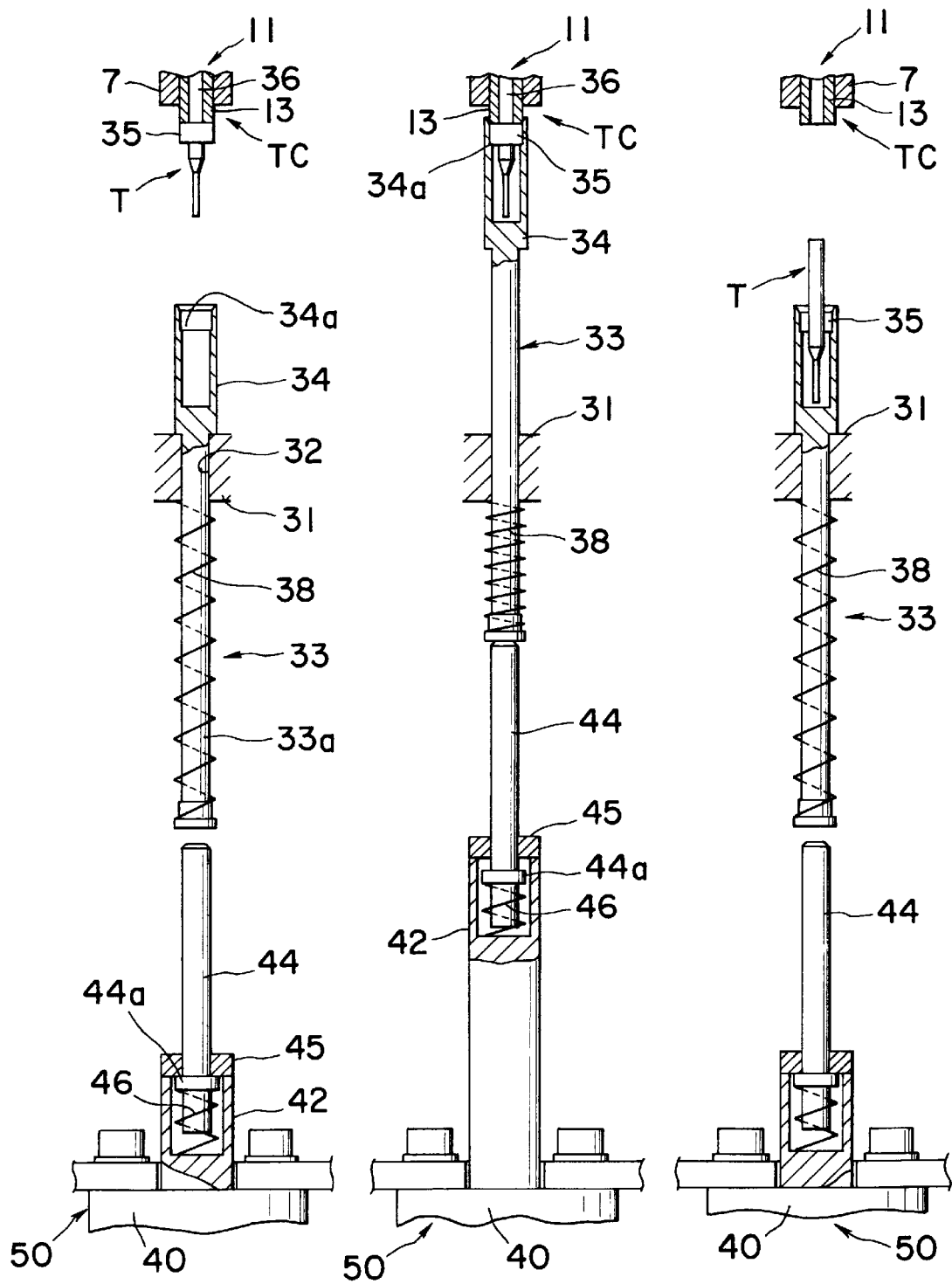
FIGS. 4A, 4B and 4C are views for assistance in explaining the tool changing operation of the tool changing mechanism of FIG. 1.

The upward movement of the lifting rod 44 relative to the piston rod 42 is limited by a cap 45 attached to the extremity of the piston rod 42 so that the lifting rod 44 may not move off the piston rod 42. The resilience of the compression spring 46 as compressed between the bottom of the bore 43 and the flange 44a resting on the cap 45 is adjusted so that the compression spring 46 will yield when the lifting rod 44 lifts up the tool post 33 and a pressure exerted through the tool post 33 on bearings supporting the spindle 11 exceeds an upper limit to avoid exerting an excessive axial pressure on the bearings. Although the spring 46 is compressed when the piston rod 42 raises the lifting rod 44 to lift up the tool post 33, the resilience of the spring 46 and the stroke of the piston rod 42 are determined so that the lower end of the lifting rod 44 may not come into contact with the bottom of the bore 43 (FIG. 4B). When the piston rod 42 is held at the lower end of its stroke, the upper end of the lifting rod 44 is slightly below the lower end of the tool post 33. The distance along the Y-axis between the two tool changing positions TC is equal to the distance between the respective axes of the two spindles 11. Accordingly, the two spindles 11 are driven for movement along the Y-axis by the Y-axis motor 4 and are located simultaneously at the corresponding tool changing positions TC, respectively.

Referring again to FIG. 2, two printed-circuit boards W are fixedly mounted on the work table 15 so as to correspond to the two spindles 11, respectively. The two machining heads 3 are moved along the Y-axis and the work table 15 is moved along the X-axis to position the printed circuit board W properly in a two-dimensional space relative to the spindles 11, respectively. The spindle heads 7 are moved simultaneously along the Z-axis to form two holes simultaneously at corresponding positions in the two printed-circuit boards W. The work table 15 is separate from the pressing mechanisms 50, and the tool magazines 30 not including the pressing mechanisms 50 are mounted on the work table 15. Therefore, the work table 15 is lighter than the work table of an equivalent prior art tool changing mechanism and hence the work table 15 can be moved at an increased speed.

Figure 3A:
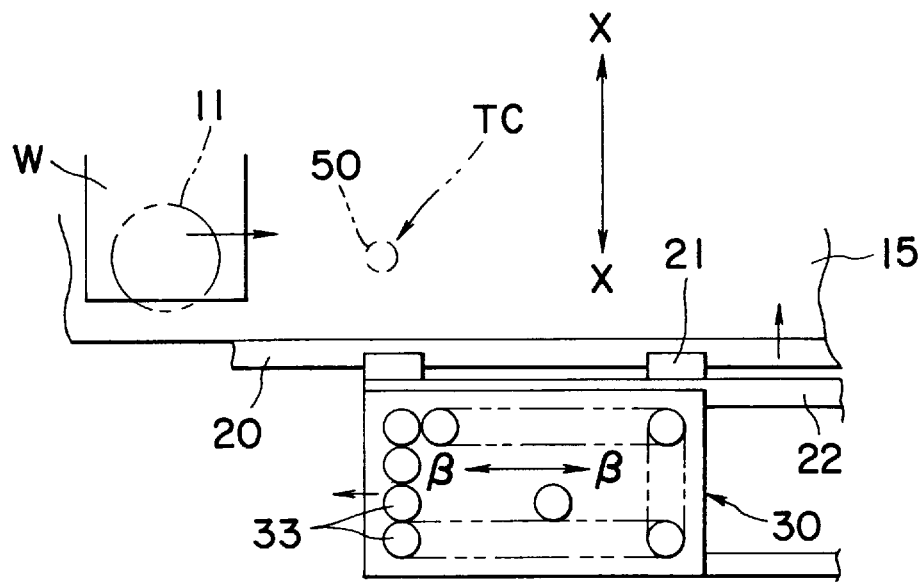
FIGS. 3A, 3B and 3C are views for assistance in explaining the tool changing operation of the tool changing mechanism of FIG. 1.
Figure 3B:
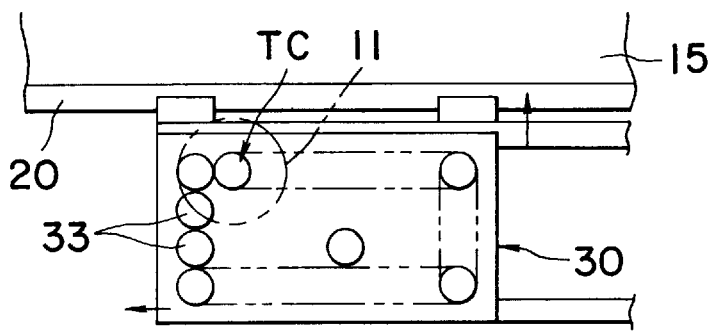

When changing tools, the spindles 11 of the two machining heads 3 are raised to a predetermined level and the machining heads 3 are moved along the Y-axis to locate the spindles 11 at the tool changing positions TC, respectively. On the other hand, the X-axis motor 16 and the $\beta$-axis motor 25 are actuated to move the work table 15 along the X-axis and to move the tool magazines 30 along the β-axis as shown in FIG. 3A. Thus, the two spindles 11 are located simultaneously at the corresponding tool changing positions TC, and the empty tool posts 33 of the tool magazines 30 respectively corresponding to the spindles 11 to receive tools T from the spindles 11 are aligned with the axes of the corresponding spindles 11, respectively. In this state, the empty tool posts 33 are aligned with the respective axes of the pressing cylinder actuators 40 as shown in FIGS. 3B and 4A.

Then, the piston rods 42 of the pressing cylinder actuators 40 are projected upward to lift the empty tool posts 33 toward the used tools T gripped by the chucks 13 of the spindles 11 as shown in FIG. 4B. Subsequently, the 30 chucks 13 of the spindles 11 are opened to release the used tools T and to transfer the used tools T from the spindles 11 to the tool posts 33. The tool posts 33 holding the used tools T by the tool holding heads 34 are lowered by the resilience of the compression springs 38 as shown in FIG. 4C as the piston rods 42 are retracted.

Figure 3C:
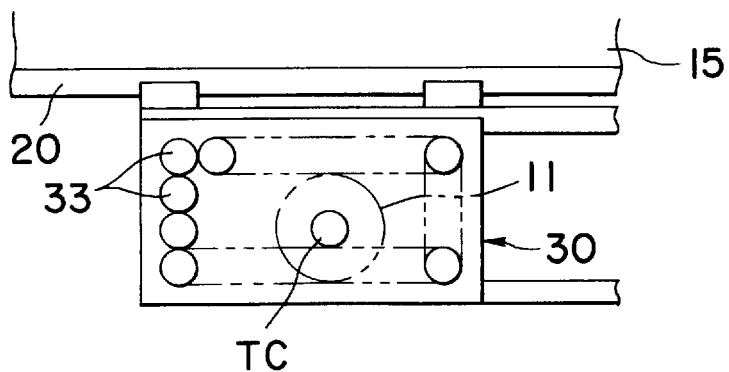

Subsequently, the work table 15 is moved along the X-axis and the tool magazines 30 are moved along the β-axis with the spindles 11 held at the tool changing positions TC to bring the tool posts 33 holding the tools T to be used into alignment with the spindles 11, respectively, as shown in FIGS. 3C and 4C. The pressing cylinder actuators 40 are actuated to lift up the tool posits 33 toward the chucks 13 of the spindles 11 to enable the chucks 13 to grip the tools T as shown in FIG. 4B. After the shanks 36 of the tools T have been clamped by the tool clamping mechanisms, not shown, of the chucks 13, the piston rods 42 of the pressing cylinder actuators 40 are retracted to their initial positions, respectively, as shown in FIG. 4A. After the completion of a series of tool changing operations, the spindles 11 are moved away from the tool changing positions TC and the work tables are moved along the X-axis to locate the spindles 11 at working positions opposite to the printed wiring boards W. Then, the spindles 11 are operated for a boring operation. When changing the tools, only the one pressing cylinder actuator needs to be operated for the one spindle 11. Therefore the configuration of a control circuit for controlling the pressing cylinder actuators 40 is far simpler than that of the control circuit of the former prior art tool changing machine, and the pressing cylinder actuators 40 consume less pressurized working fluid than the latter prior art tool changing machine.

Referring to FIG. 4B, when transferring the used tool T from the spindle 11 to the empty tool post 33, the piston rod 42 is projected to lift up the lifting rod 44. While the lifting rod 44 is thus lifted up, the upper end of the lifting rod 44 comes into contact with the lower end of the tool post 33, and lifts up the tool post 33 against the resilience of the compression spring 38. When the lifting rod 44 lifts up the tool post 33, the compression spring 46 is not deformed because the resilience of the compression spring 46 is greater than that of the compression spring 38. Consequently, the collar 35 of the tool T held on the spindle 11 is received in the tool holding head 34 and rests on a step 34a formed in the bore of the tool holding head 34 to stop the upward movement of the tool post 33. The piston rod 42 is moved slightly upward after the upward movement of the tool post 33 has been stopped to press the tool holding head 34 firmly against the collar 35 of the tool T. When the tool holding head 34 is thus pressed against the collar 35 of the tool T, the compression spring 46 is strained to avoid exerting excessive load on the bearings supporting the spindle 11. This function to avoid exerting excessive load on the bearings supporting the spindle 11 is effective also when transferring a new tool T from the tool post 33 to the chuck 13 of the spindle 11 as shown in FIG. 4B. Accordingly, the bearings supporting the spindle 11 are not damaged even if the pressing cylinder actuator 40 is not a special cylinder actuator of a small pressing capacity.

As is apparent from the foregoing description, since only the one tool pressing mechanism is used for the one spindle (one tool magazine), the tool changing mechanism needs a relatively small number of component parts and can be easily assembled. Since only the one tool mechanism needs to be controlled for a tool changing operation for the one spindle, the control circuit for controlling the tool pressing mechanism has a simple configuration. When the tool pressing mechanism employs a cylinder actuator driven by a pressurized working fluid, the cylinder actuator can be controlled by the simple control circuit for an economical operation consuming a reduced quantity of the pressurized working fluid. Since the tool pressing mechanism is separated from the tool magazine and is held on a fixed member, the design of the tool pressing mechanism is not subject to restrictions imposed by the arrangement of the tool posts. For example, the tool pressing mechanism may employ an inexpensive general-purpose cylinder actuator. Since the work table does not carry the tool pressing mechanisms, the work table is lightweight and is capable of being moved at an increased speed for efficient machining.

Since one of the tool posts of the tool magazine is located at the predetermined tool changing position by moving the work table along the X-axis and by moving the tool magazine along the Y-axis relative to the work table, the construction of the tool changing mechanism is simpler than that of the prior art tool changing mechanism which moves the tool magazine separately from the work table in orthogonal directions.

An increased number of tool posts can be arranged in rows and columns in the tool magazine. Since the pressing force of the pressing cylinder actuator is absorbed by the compression spring, the exertion of an excessive load on the spindle can be avoided when changing the tool.

Although the invention has been described in its preferred form with a certain degree of particularity, obviously many changes and variations are possible therein. It is therefore to be understood that the present invention may be practiced otherwise than as specifically described herein without departing from the scope and spirit thereof. For example, the tool changing mechanism of the invention may be used in plate drilling machines other than a printed-circuit board drilling machine.

What is claimed is:

1. A tool changing mechanism to be incorporated into a plate drilling machine having a spindle movable within in a range, said tool changing mechanism comprising:

a tool magazine including a plurality of tool posts, movable to bring one of the tool posts into alignment with the spindle;

a locating mechanism for locating the tool magazine so that one of the tool posts is brought into alignment with the spindle, said locating mechanism comprising a movable work table for mounting a plate to be drilled, and means for supporting the tool magazine on the work table to be movable relative to the work table; and a tool pressing mechanism disposed in a fixed position on a side of the tool magazine opposite to the spindle at a tool changing position provided in the range in which the spindle is movable, said tool pressing mechanism being operable to press said one of the tool posts aligned with the spindle toward the spindle for a tool changing operation.

2. The tool changing mechanism according to claim 1, wherein said tool magazine includes said tool posts in rows.

3. The tool changing mechanism according to claim 1, wherein said tool pressing mechanism is fixedly mounted on a bed of the plate drilling machine at a position coaxial with the spindle.

4. The tool changing mechanism according to claim 3, wherein said work table is movable in a first direction and said tool magazine is movable in a second direction transverse to said first direction.

5. The tool changing mechanism according to claim 3, wherein said tool pressing mechanism includes a lifting rod for pressing said one of the tool posts, said lifting rod being resiliently movable backward when it presses the one of the tool posts.

6. The tool changing mechanism according to claim 1, wherein said tool pressing mechanism includes a lifting rod for pressing said one of the tool posts, said lifting rod being resiliently movable backward when it presses the one of the tool posts.

7. The tool changing mechanism according to claim 1, wherein the tool pressing mechanism comprises:
- a pressing cylinder actuator fixedly held on a fixed member of the plate drilling machine, and provided with a piston rod;
- a lifting rod to be brought into contact with the tool post to lift up the tool post, having a part thereof inserted in a bore formed in an upper end of the piston rod so that the lifting rod is able to move axially relative to the piston rod and provided with a flange;
- a compression spring strained between a bottom of the bore of the piston rod and the flange of a lower part of the lifting rod so as to bias the lifting rod upward; and
- a cap attached to a free end of the piston rod so that the flange of the lower part of the lifting rod biased by the compression spring rests on an inner surface thereof to retain the lower part of the lifting rod in the bore of the piston rod.

8. A tool changing mechanism to be incorporated into a plate drilling machine having a spindle movable within a range, said tool changing mechanism comprising:
- a tool magazine including a plurality of tool posts, movable to bring one of the tool posts into alignment with the spindle;
- a locating mechanism for locating the tool magazine so that one of the tool posts is brought into alignment with the spindle; and
- a tool pressing mechanism disposed in a fixed position on a side of the tool magazine opposite to the spindle at a tool changing position provided in the range in which the spindle is movable, said tool pressing mechanism being operable to press said one of the tool posts aligned with the spindle toward the spindle for a tool changing operation;
- said tool pressing mechanism comprising:
  - a pressing cylinder actuator fixedly held on a fixed member of the plate drilling machine, and provided with a piston rod;
  - a lifting rod to be brought into contact with the tool post to lift up the tool post, having a part thereof inserted in a bore formed in an upper end of the piston rod so that the lifting rod is able to move axially relative to the piston rod and provided with a flange;
  - a compression spring strained between a bottom of the bore of the piston rod and the flange of a lower part of the lifting rod so as to bias the lifting rod upward; and
  - a cap attached to a free end of the piston rod so that the flange of the lower part of the lifting rod biased by the compression spring rests on an inner surface thereof to retain the lower part of the lifting rod in the bore of the piston rod.

9. The tool changing mechanism according to claim 8, wherein said tool magazine includes said tool posts in rows.

10. The tool changing mechanism according to claim 8, wherein said locating mechanism comprises a movable work table for mounting a plate to be drilled.

11. The tool changing mechanism according to claim 10, wherein said work table is movable in a first direction and said tool magazine is movable in a second direction transverse to said first direction.

12. The tool changing mechanism according to claim 8, wherein said tool pressing mechanism is fixedly mounted on a bed of the plate drilling machine at a position coaxial with the spindle.

13. The tool changing mechanism according to claim 8, wherein said tool pressing mechanism includes a lifting rod for pressing said one of the tool posts, said lifting rod being resiliently movable backward when it presses the one of the tool posts.

14. A tool changing mechanism to be incorporated into a plate drilling machine having a spindle movable within a range, said tool changing mechanism comprising:
- a tool magazine including a plurality of tool posts, movable to bring one of the tool posts into alignment with the spindle;
- a locating mechanism for locating the tool magazine so that one of the tool posts is brought into alignment with the spindle, said locating mechanism comprising a movable work table for mounting a plate to be drilled, said work table supporting said tool magazine thereon; and
- a tool pressing mechanism disposed in a fixed position on a side of the tool magazine opposite to the spindle at a tool changing position provided in the range in which the spindle is movable, said tool pressing mechanism being operable to press said one of the tool posts aligned with the spindle toward the spindle for a tool changing operation.

15. The tool changing mechanism according to claim 14, wherein said tool magazine includes said tool posts in rows.

16. The tool changing mechanism according to claim 14, wherein said work table is movable in a first direction and said tool magazine is movable in a second direction transverse to said first direction.

17. The tool changing mechanism according to claim 14, wherein said tool pressing mechanism is fixedly mounted on a bed of the plate drilling machine at a position coaxial with the spindle.

18. The tool changing mechanism according to claim 14, wherein said tool pressing mechanism includes a lifting rod for pressing said one of the tool posts, said lifting rod being resiliently movable backward when it presses the one of the tool posts.

19. The tool changing mechanism according to claim 14, wherein said tool pressing mechanism comprises:
- a pressing cylinder actuator fixedly held on a fixed member of the plate drilling machine, and provided with a piston rod;
- a lifting rod to be brought into contact with the tool post to lift up the tool post, having a part thereof inserted in a bore formed in an upper end of the piston rod so that the lifting rod is able to move axially relative to the piston rod and provided with a flange;

a compression spring strained between a bottom of the bore of the piston rod and the flange of a lower part of the lifting rod so as to bias the lifting rod upward; and a cap attached to a free end of the piston rod so that the flange of the lower part of the lifting rod biased by the compression spring rests on an inner surface thereof to retain the lower part of the lifting rod in the bore of the piston rod.

* * * * *